United States Patent [19]

Petrovic

[11] Patent Number: 5,032,807
[45] Date of Patent: Jul. 16, 1991

[54] NOTCH FILTER USING HELICAL TRANSMISSION LINE AND COAXIAL CAPACITOR

[75] Inventor: Branislav Petrovic, La Jolla, Calif.

[73] Assignee: General Instrument Corporation, New York, N.Y.

[21] Appl. No.: 377,598

[22] Filed: Jul. 10, 1989

[51] Int. Cl.⁵ .......................... H03H 7/12; H01P 1/20
[52] U.S. Cl. .................................... 333/176; 333/175; 333/219; 333/202
[58] Field of Search ................ 333/202, 204, 205–207, 333/222–226, 233, 235, 182, 176, 185; 361/302; 336/115

[56] References Cited

U.S. PATENT DOCUMENTS

| | | | |
|---|---|---|---|
| 3,007,121 | 10/1961 | Schlicke | 333/182 |
| 3,121,205 | 2/1964 | Foss | 333/233 |
| 3,683,244 | 8/1972 | Kitamura et al. | 361/302 |
| 3,820,045 | 6/1974 | Igarashi | 333/185 |
| 3,936,776 | 2/1976 | Sundquist | 333/206 X |
| 4,052,684 | 10/1977 | Schmalz | 333/223 |
| 4,182,997 | 1/1980 | Brambilla | 333/176 X |
| 4,186,359 | 1/1980 | Kaegebein | 333/223 X |
| 4,490,699 | 12/1984 | Yanagida | 333/202 |
| 4,682,131 | 7/1987 | May | 333/219 X |
| 4,801,904 | 1/1989 | Sakamoto et al. | 333/182 |

FOREIGN PATENT DOCUMENTS 0902118 2/1982 U.S.S.R. ............................. 333/209

Primary Examiner—Eugene R. LaRoche
Assistant Examiner—Seung Ham
Attorney, Agent, or Firm—Barry R. Lipsitz

[57] ABSTRACT

A notch filter comprises a helical transmission line enclosed in a conductive activity, and a high Q capacitor coupled to form a series-resonant circuit. The capacitor is fabricated from a portion of coaxial cable having an outer conductor forming a first plate of the capacitor and an inner conductor forming the second plate of the capacitor. The notch filter is particularly suited for rejecting terrestrial interference in a C-band tuner at an intermediate frequency of about 400 MHz.

12 Claims, 3 Drawing Sheets

NOTCH FILTER USING HELICAL TRANSMISSION LINE AND COAXIAL CAPACITOR

BACKGROUND OF THE INVENTION

The present invention relates to an improved notch filter circuit and more particularly, to a notch filter constructed from a novel helical transmission line inductance and coaxial capacitor. The notch filter has application in a variety of circuits, including tuners for use in satellite receivers.

A tuner for a satellite receiver has to provide several signal processing functions. Among these are to receive an RF signal (e.g., from an antenna) providing reception of a plurality (e.g., 16) channels, with each channel in the −65 dBm up to the −20 dBm level range. The RF signal must then be down-converted to an appropriate intermediate frequency ("IF"), and provided to a demodulator at a constant IF signal level over the entire RF signal range.

In addition to the above, a tuner for a satellite receiver that operates in the C-band (3.7 to 4.2 gigahertz ("GHz")) requires a terrestrial interference ("TI") filter to reject the interference caused by terrestrial microwave communications. Such microwave communications occur in the same frequency range (i.e., 3.7 to 4.2 GHz) as satellite television.

In order to be useful, a tuner for use in a satellite receiver must perform the above functions with minimum signal quality degradation and at minimum cost. To preserve the signal quality, a TI filter used in a C-band satellite receiver tuner should operate with a fairly sharp notch, typically on the order of 4 MHz maximum bandwidth at the 3 dB point, with a 15 dB notch depth. In order to ensure that this specification is met for all conditions, including component tolerance, gain/loss variations, temperature variations, and the like, the TI filter should be designed to provide, at nominal conditions, a 3 MHz bandwidth at 3 dB, with a 15 dB notch depth.

The specifications set forth above pose difficulty in the design of a suitable TI filter for use in a satellite receiver tuner. The relatively narrow bandwidth of the notch (i.e., 3 MHz at 3 dB) suggests the use of a relatively low IF frequency. The reason for this is that in order to operate at a higher IF, the reactive elements in the filter must have a higher "quality factor" Q. As is well known in the art, Q is a dimensionless parameter, calculated by dividing the product of a filter's resonant frequency and inductance by the resistance of the filter.

The use of a low IF frequency in a satellite tuner has three drawbacks. First, if the IF is lower than about 250 MHz, an image problem arises in the IF conversion process. In order to resolve this problem, additional circuitry such as a tracking RF filter is necessary. Second, with a lower IF it is more difficult to achieve linear FM ("frequency modulation") demodulation, particularly in quadrature demodulators. Linear FM demodulation is also difficult with a low IF because it is more difficult to keep the group delay low in IF filters at lower frequencies. Third, high quality FM demodulator integrated circuit chips are currently available only at frequencies above 300 MHz.

For these reasons, it is preferable to provide a satellite receiver tuner with an IF of above 300 MHz. At such frequencies, a TI filter will require an approximate Q of 1,000, and a stability of approximately 20 ppm/ °C. This is difficult to achieve, even with costly surface acoustic wave ("SAW") devices.

It would be advantageous to provide a TI filter that operates above 300 MHz, to enable the construction of a satellite receiver tuner or the like that meets the criteria set forth above. It would be further advantageous to provide such a TI filter that is economical, reliable, and easy to construct.

The present invention provides such a TI filter, that is implemented in helical transmission line techniques.

SUMMARY OF THE INVENTION

In accordance with the present invention, a notch filter is provided comprising a helical transmission line having a first end and a second end. The helical transmission line is contained in a conductive cavity. Means are provided for coupling the first end of the helical transmission line to the cavity. Means are also provided for coupling the second end of the helical transmission line to a capacitor to form a series-resonant circuit.

A capacitor for use in the notch filter can comprise a portion of coaxial cable having an outer conductor and a concentric inner conductor. The outer conductor forms a first plate of the capacitor with the inner conductor forming a second plate thereof. In a preferred embodiment, the second end of the helical transmission line is coupled to the outer conductor of the coaxial capacitor.

The conductive cavity in which the helical transmission line resides can comprise a closed box having a relatively small opening to accommodate the coupling of the second end of the transmission line to the capacitor. The box can be any shape, for example square, rectangular, or cylindrical. Tuning means, integral with the box, are provided for adjusting the resonant frequency of the series-resonant circuit. In one embodiment, one wall of the closed box comprises an adjustable plate disposed perpendicular to the longitudinal axis of the helical transmission line. The tuning means comprises means for varying the position of the plate along said axis. In another embodiment, the tuning means comprises a slug for adjustable penetration into the box along the longitudinal axis of the helical transmission line.

The present invention also provides an inductor for use in a notch filter, comprising a helical transmission line having a first end and a second end. A conductive cavity contains the helical transmission line, and means are provided for coupling the first end of the helical transmission line to the cavity. An opening in the cavity provides access to the second end of the transmission line. The cavity can function as a first terminal for coupling the inductor to an external circuit, and the second end of the transmission line can function as a second terminal for coupling the inductor to an external circuit. The cavity can comprise a closed box. Tuning means, integral with the box, are provided for adjusting the effective length of the transmission line, and thus its inductance.

A high Q capacitor is provided in accordance with the present invention, comprising a portion of coaxial cable having an outer conductor forming a first capacitor plate and a concentric inner conductor forming a second capacitor plate. The inner conductor extends beyond the confines of the outer conductor to provide a lead for coupling to the second capacitor plate. The outer conductor can comprise a copper sheath having an exposed portion to provide a terminal for coupling to the first capacitor plate. The length of the coaxial cable used to form the capacitor is typically less than one-quarter inch. In a preferred embodiment, the inner conductor of the capacitor extends beyond the confines of the outer conductor at both ends thereof, to form a component resembling a cylindrical resistor in appearance.

DETAILED DESCRIPTION OF THE INVENTION

There are various types of helical filters known in the art. However, the helical elements are typically used as band-pass elements, wherein parallel resonance is utilized. In the present invention, a TI filter is provided, wherein transmission line properties of a helical element are used. The transmission line resonates in series resonance with an external capacitor, providing a notch effect.

Figure 3:
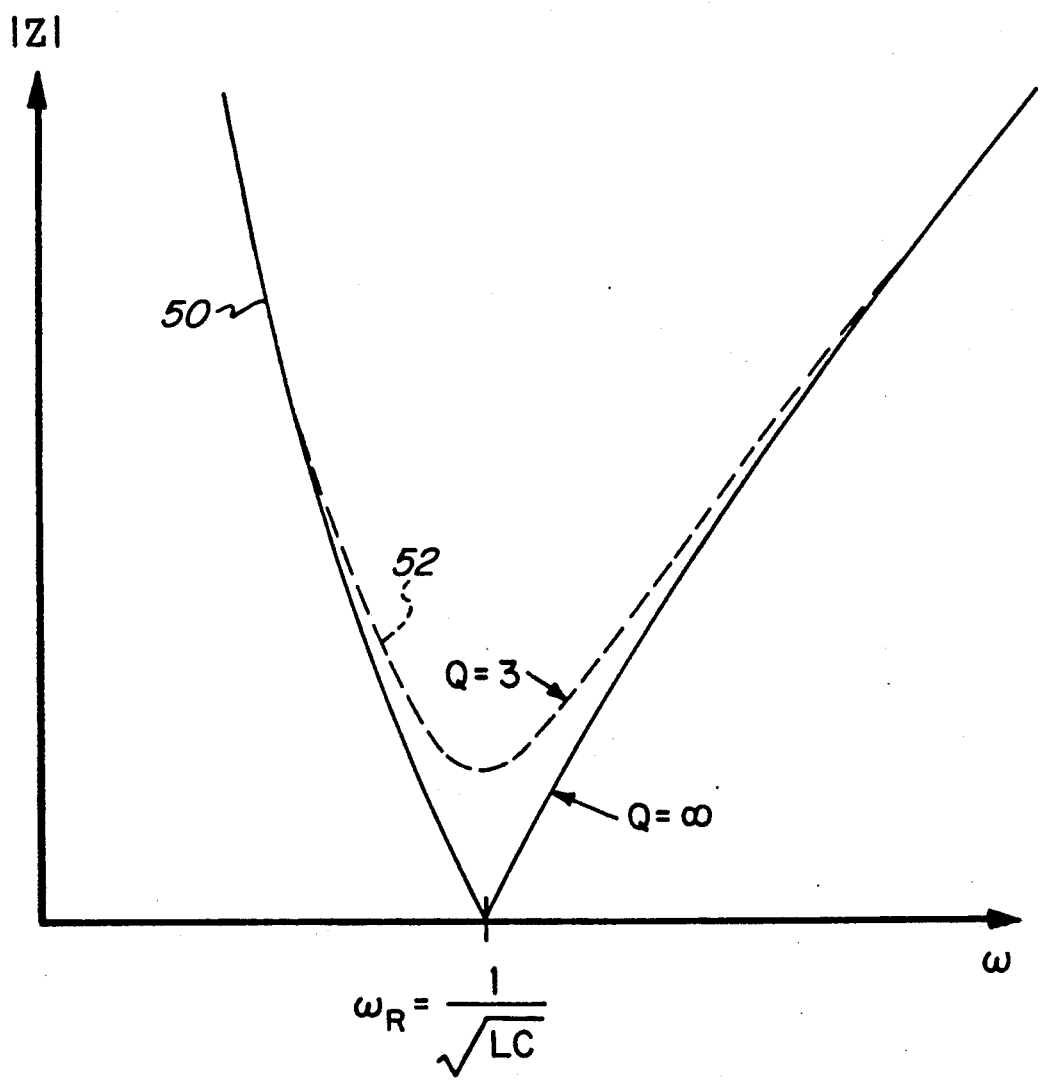
FIG. 3 is a curve, plotting impedance against frequency for a typical notch filter at two different values of Q.

Various conventional notch filters are well known. For example, an inductor and capacitor coupled in series provide a resonant circuit that exhibits a "notch" where the impedance significantly decreases at the resonant frequency. The curve of FIG. 3 illustrates the performance of a notch filter for two different values of "quality factor" Q. Curve 50 shows the ideal performance for Q=infinity. Curve 52 illustrates a more typical result where Q=3. As shown, the impedance of a notch filter circuit approaches zero at the resonant frequency, and remains high at other frequencies. Thus, a notch filter is useful in rejecting interference which occurs at the resonant frequency of the filter.

Figure 1:
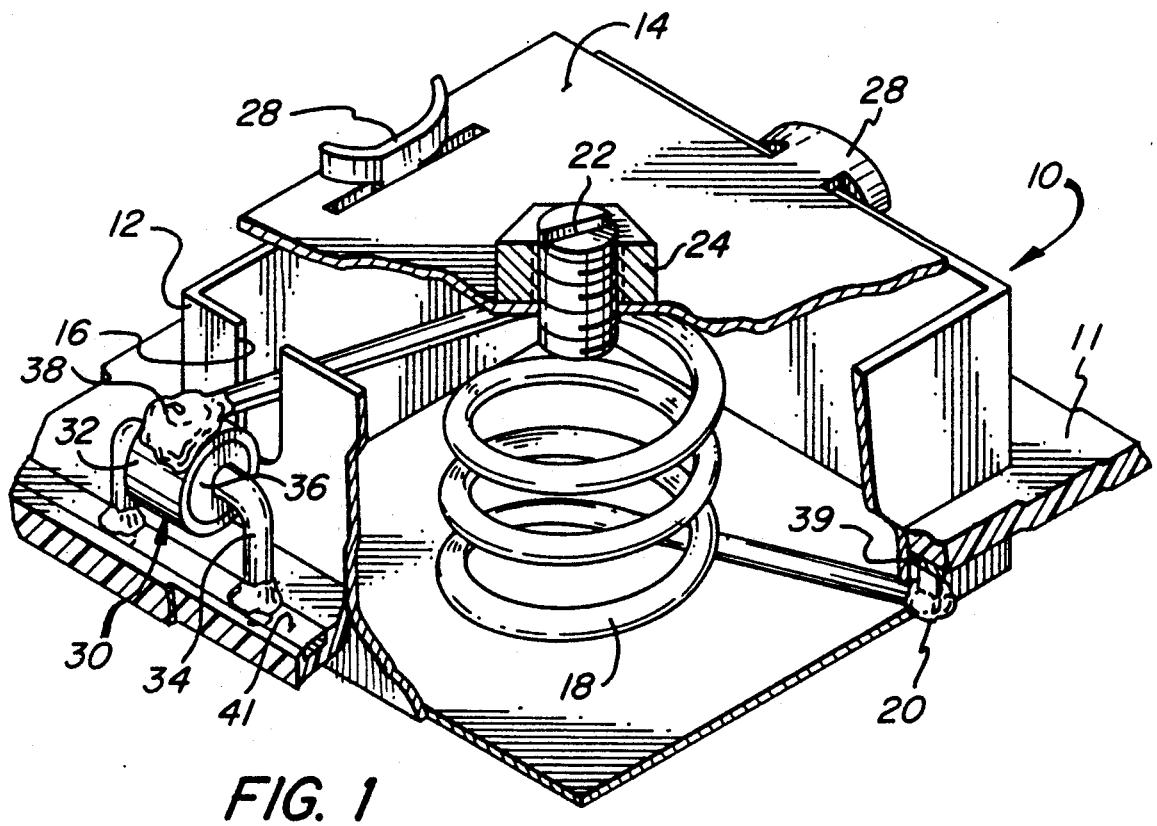
FIG. 1 is a perspective view of a notch filter constructed in accordance with the present invention.

The construction details of the notch filter in accordance with the present invention are illustrated in the perspective view of FIG. 1. An inductance, generally designated 10, is coupled in series with a capacitor, generally designated 30. Both components are mounted on a printed circuit board 11. Inductor 10 is formed using a high Q helical transmission line 18 which is wound to form a coil. Helical transmission line 18 is short circuited (i.e., coupled) to a conductive cavity or metal box 12 at a first end 20. Box 12, which can be of any suitable shape including rectangular, square, or cylindrical, will typically be fabricated lo from copper. Thus, first end 20 of helical transmission line 18 can be soldered directly to the copper surface of the box, which in turn is connected to a ground plane 39 on printed circuit board 11. A second end 38 of transmission line 18 is coupled to a first conductor 41 of a signal line 40, through capacitor 30 as described in detail below. The second end 38 of transmission line 18 passes through an opening 16 in box 12, that is relatively small with respect to the dimensions of the box, and is provided to accommodate the coupling of the transmission line to the capacitor.

Figure 4:
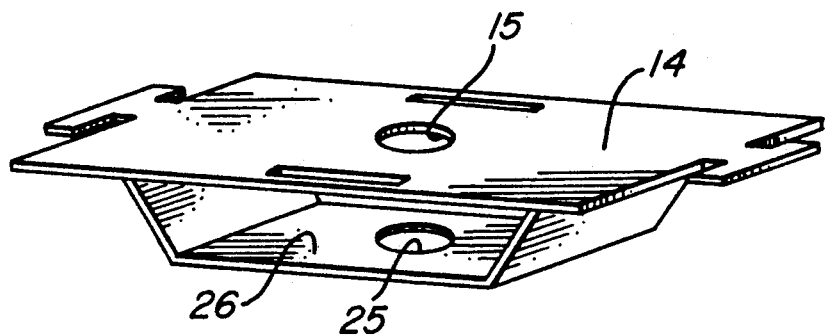
FIG. 4 is a perspective view of an alternate tuning element for the notch filter.

Box 12 is preferably closed by a lid 14. Tuning means are provided in lid 14 to vary the effective electrical length of helical transmission line 18, and thereby enable limited adjustment of the notch frequency (i.e., resonant frequency) of the notch filter. In the embodiment shown in FIG. 1, a threaded slug 22 is provided in mating engagement with a threaded nut 24 mounted to lid 14. Slug 22 can be adjusted by turning it clockwise or counterclockwise to vary its penetration into box 12 along the approximate longitudinal axis of helical transmission line 18. In an alternate embodiment illustrated in FIG. 4, a flexible metal plate 26 can be mounted to lid 14. Holes 15 and 25 are provided in lid 14 and plate 26, respectively, to enable the position of the plate to be adjusted by a suitable tool, such as a thin screwdriver or hook. Lid 14 may be secured to box 12 using bendable tabs 28, in a conventional manner.

The construction of inductance 10 provides many advantages. For example, the grounded cavity provided by box 12 and lid 14 shields the helical transmission line 18 to prevent unwanted external interference from acting on the transmission line. The cavity also advantageously utilizes the stray capacitance 17 that results between the transmission line and ground, as illustrated in the schematic diagram of FIG. 2. Stray capacitance 17 acts as a capacitive shunt, and in cooperation with the transmission line 18 and cavity 12, 14, provides a bandpass structure (parallel LC element) that minimizes signal loss which would otherwise occur due to the radiation of transmission line 18 in open space. By reducing such loss, the structure of the present invention provides an inductance with a substantially increased Q.

Figure 2:
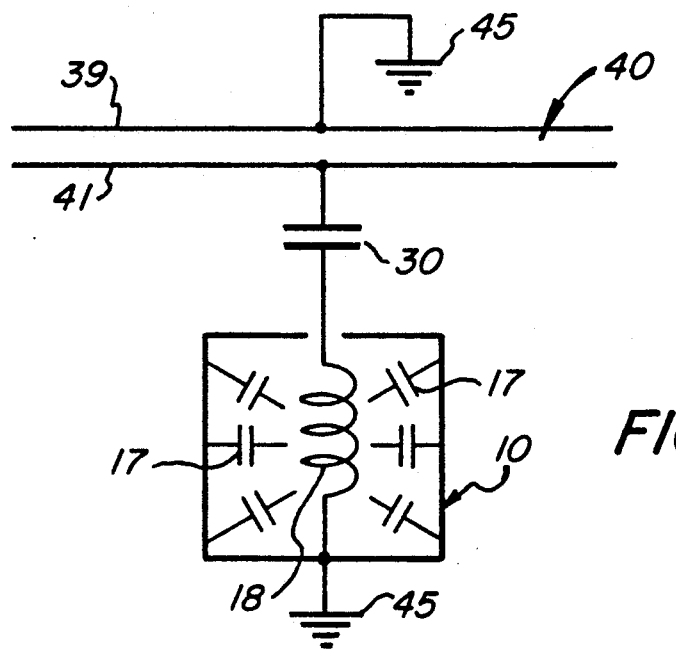
FIG. 2 is a schematic diagram of the notch filter circuit of the present invention.

The circuit diagram of the notch filter is shown in FIG. 2. Signal line 40 can be 50 ohm microstrip line provided on a printed circuit board, or any other type of transmission line well known in the art. In the embodiment illustrated, signal line 40 comprises a conventional microstrip line 41 and a ground plane 39. Capacitor 30 and inductance 10 are coupled in series between line 41 and ground plane 39, as indicated by ground terminal 45.

Capacitor 30 is also of novel construction. It is fabricated from a piece of semi-rigid coaxial cable having an outer conductor 32 and an inner conductor 34, separated by a dielectric 36 comprising Teflon ® or the like. Outer conductor 32 can be a solid copper sheath which is exposed to enable the second end 38 of transmission line 18 to be directly soldered thereto. In a preferred embodiment, inner conductor 34 is a solid wire which extends beyond the confines of outer conductor 32 at both ends thereof, to form a component resembling a cylindrical resistor in appearance. Both ends of inner conductor 34 are soldered to the microstrip line 41 in the structure illustrated in FIG. 1.

In an application where a notch filter is to be constructed having a notch frequency at 412.78 MHz, helical transmission line 18 can be fabricated from a 14 gauge (0.063" diameter) solid copper or silver plated wire, wound into a self-supporting coil having 3⅜ turns, a mid-conductor to mid-conductor diameter of 0.43", a pitch of 0.063" (equal to the wire diameter), and which is centrally located in box 12. The ratio of the coil diameter to the width of the box is approximately 1:2. This ratio can be adjusted to optimize the operation of the device. The bottom turn of the coil is approximately 0.1" above the bottom of the box.

Box 12 and lid 14 combine to form a solid copper box having a length of 1", width of 1", and height of ⅜". Tuning slug 22 is fabricated from brass and can penetrate into box 12 anywhere from zero to about 0.25 inches. The coil and box together have a Q of about 1000 and a resonant frequency of 600 MHz.

Capacitor 30 is fabricated from 50Ω, semi-rigid type RG#.402/u coaxial cable, with outer conductor 32 having a length of 0.065". The length of inner conductor 34 is not critical, and is chosen for convenient mounting to a printed circuit board or the like. The resulting capacitor has a value of 0.2 pf and a Q of about 500.

Those skilled in the art will appreciate that other component specifications and dimensions will produce a notch filter with different electrical characteristics. The size of the cavity is determined by the desired Q and resonant frequency of the inductance. Q is proportional to the volume of the cavity. It will also be appreciated that although capacitor 30 is shown coupled to microstrip line 41, with the first terminal of transmission line 18 connected to ground, the notch filter could alternately be installed with the capacitor connected to ground and the helical transmission line connected to the microstrip line 41. However, such orientation is more difficult to achieve on a conventional printed circuit board, since it is convenient to mount the box enclosing the coil directly to ground plane 39.

The performance of a filter constructed in accordance with the above example has been found to be excellent. The notch depth was measured at 15 dB with a 2.5 MHz 3 dB bandwidth. The temperature stability was better than 0.2 MHz for a 25° C. change.

Figure 5:
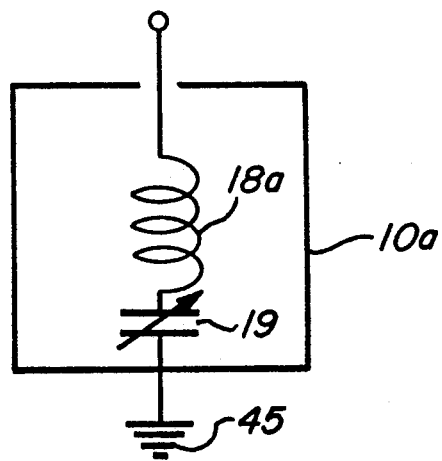
FIG. 5 is a schematic diagram of an alternate construction for the transmission line inductor used in the notch filter.

In an alternate embodiment, as illustrated in FIG. 5, inductor 10a is made more compact by providing a variable capacitor 19 in series with coil 18a within the cavity. Capacitor 19 serves to extend the electrical length of helical transmission line 18a, so that the same performance can be achieved in a smaller device. The electrical characteristics of the device can be varied simply by tuning variable capacitor 19. The inductor 10a of FIG. 5 would replace inductor 10 of FIG. 2 to provide a complete notch filter circuit. For purposes of clarity, the stray capacitance 17 is not illustrated in FIG. 5, although it is present in the actual device.

It will now be appreciated that the present invention provides a notch filter for use in RF circuits and the like. The present invention also provides a novel helical transmission line inductor, and a high Q capacitor fabricated from a portion of coaxial cable.

Although the present invention has been illustrated with reference to particular embodiments thereof, those skilled in the art will recognize that various modifications and adaptations may be made without departing from the spirit and scope of the invention, as set forth in the following claims.

What is claimed is:

1. A notch filter comprising:
   a helical transmission line having a first end and second end;
   a grounded conductive cavity containing said helical transmission line;
   means for coupling the first end of said helical transmission line to said cavity at a bottom end of the cavity; and
   means for passing the second end of said helical transmission line through an opening at a top end of the cavity for coupling to an external capacitor to form a single series-resonant circuit.

2. The notch filter of claim 1 wherein said capacitor comprises a portion of coaxial cable having an outer conductor and a concentric inner conductor;
   said outer conductor forming a first plate of said capacitor, and
   said inner conductor forming a second plate of said capacitor.

3. The notch filter of claim 2 wherein the second end of said helical transmission line is coupled to said outer conductor.

4. The notch filter of claim 1 wherein said conductive cavity is a closed box having a relatively small opening at said top end for passing the second end of said transmission line to said external capacitor adjacent said box.

5. The notch filter of claim 4 further comprising:
   tuning means, integral with said box, for adjusting the resonant frequency of said series-resonant circuit.

6. The notch filter of claim 5 wherein one wall of said closed box comprises an integral adjustable plate disposed generally perpendicular to the longitudinal axis of said helical transmission line, and said tuning means comprises means for varying the position of the plate along said axis by bending the plate.

7. The notch filter of claim 5 wherein said tuning means comprises a slug for adjustable penetration into said box in the general direction of the longitudinal axis of said helical transmission line.

8. A notch filter comprising:
   a helical transmission line having a first end and a second end;
   a grounded conductive cavity containing said helical transmission line;
   means, including an opening at a top end of said cavity, for physically connecting the first end of said helical transmission line to receive a signal to be filtered;
   means for coupling the second end of said helical transmission line to a first end of a capacitor within said cavity and
   means for coupling a second end of said capacitor to said cavity at a bottom end of the cavity to form a single series-resonant circuit.

9. The notch filter of claim 8 wherein said cavity is a closed box.

10. The notch filter of claim 9 further comprising:
    tuning means, integral with said box, for adjusting the inductance provided by said transmission line.

11. The notch filter of claim 10 wherein one wall of said closed box comprises an integral adjustable plate disposed generally perpendicular to the longitudinal axis of said helical transmission line, and said tuning means comprises means for varying the position of the plate along, said axis by bending the plate.

12. The notch filter of claim 10 wherein said tuning means comprises a slug for adjustable penetration into said box in the general direction of the longitudinal axis of said helical transmission line.

* * * * *